INVENTOR.
DENNIS J. GOODING

BY David M. Kay

AGENT.

Aug. 4, 1970 D. J. GOODING 3,522,541

DIGITAL MATCHED FILTER EMPLOYING QUADRATURE COMPONENT CORRELATION APPARATUS

Filed Nov. 13, 1967 6 Sheets-Sheet 2

INVENTOR.
DENNIS J. GOODING

BY David M. Keay

AGENT.

INVENTOR.
DENNIS J. GOODING

BY David M. Keay

AGENT.

INVENTOR.
DENNIS J. GOODING

BY David M. Kay

AGENT.

Aug. 4, 1970 D. J. GOODING 3,522,541

DIGITAL MATCHED FILTER EMPLOYING QUADRATURE COMPONENT CORRELATION APPARATUS

Filed Nov. 13, 1967 6 Sheets-Sheet 5

INVENTOR.
DENNIS J. GOODING

BY David M. Keay

AGENT.

| CORRELATION INTERVALS | 4 | 3 | 2 | 1 |
|---|---|---|---|---|
| x | 1 | 0 | 0 | 1 |
| y | 1 | 0 | 1 | 0 |

INVENTOR.
DENNIS J. GOODING

BY David M. Kay

AGENT.

United States Patent Office 3,522,541
Patented Aug. 4, 1970

3,522,541

DIGITAL MATCHED FILTER EMPLOYING QUADRATURE COMPONENT CORRELATION APPARATUS

Dennis J. Gooding, Acton, Mass., assignor to Sylvania Electric Products Inc., a corporation of Delaware Filed Nov. 13, 1967, Ser. No. 682,437
Int. Cl. H04b *1/10*
U.S. Cl. 325—324 7 Claims

ABSTRACT OF THE DISCLOSURE

A digital matched filter wherein a received signal is directed simltaneously to first and second mixers in the first of which it is mixed with an analog carrier signal and in the second of which it is mixed with the analog carrier signal shifted in phase, thus establishing an in-phase and quadrature component of the received signal. The mixer output signals are quantized, sampled and directed to a logic unit where they are compared bit by bit with a digital reference signal to establish correlation.

BACKGROUND OF THE INVENTION

This invention relates to matched filters and in particular to a digital matched filter useful, for example, in communication systems where synchronization of a received signal with a reference signal is necessary to facilitate further processing of the received signal.

One method for achieving rapid synchronization between a received signal and a reference signal in a communication system, for example, in a pseudo-random phase-keyed spread-spectrum system, is to employ a matched filter to recognize the occurrence of a particular segment of the received signal and upon recognition of the segment to attain synchronization between the received signal and a reference signal. Once synchronization is obtained, the received signal is directed to a data processing unit for further processing. In an anti-jam or low detectibility system, for example, it is desirable that the matched filter be dynamic, that is, that the segment of the spread-spectrum signal to be recognized be changed frequently.

One type of dynamic matched filter is an optical-tapped delay line in which the received signal and the reference signal propagate at the same fixed rate but in opposite directions in two parallel quartz delay lines. Polarized light is directed transversely through the two delay lines, is acted upon sequentially by the patterns of strain waves in the two lines, and thence is passed through a polarization analyzer to a photodetector. The output signal of the photodetector is proportional to the cross correlation between the signals in the two delay lines with a maximum output signal occurring when correlation is achieved. Not only is the optically-tapped delay line match filter bulky and sensitive to shock and vibration, but it is also limited in versatility in that the rate at which the reference signal enters the delay line cannot be varied to change the rate or direction of the relative time-slippage between the received signal and the reference signal. Further, the optically-tapped deline line requires that the reference signal be a time inverted replica of the received signal because the two signals are propagated in opposite directions along their respective delay lines. To generate the reference signal, long segments of the received code must be stored and scanned in reverse to obtain a time reversed sequence. It would be advantageous to have and it is one of the objects of this invention to provide a digital matched filter wherein the rate and direction of the relative time-slippage between the received and reference signals can be varied.

SUMMARY OF THE INVENTION

In accordance with the present invention, a digital matched filter includes a receiver which generates a pair of diigtal quadrature components in response to an input signal, a digital reference sequence generator and a logic circuit which compares the quadrature components of the received signal with a digital reference signal generated by the reference sequence generator. The logic unit employs a combination of digital storage means, typically shift registers, and gates to perform a bit by bit comparison of the quadrature components and the reference sequence signal. The advantages in digitizing the input signal and employing a digital storage means such as a shift register, as compared to employing continuous signals and delay lines, include not only the reduction in weight size and shock sensitivity and stability, but also the rate and direction of a relative slippage between the two signals can be varied.

BRIEF DESCRIPTION OF THE DRAWINGS

The invention will be more fully understood from the following detailed description taken in conjunction with the accompanying drawings in which.

DETAILED DESCRIPTION OF THE INVENTION

System description

Figure 1:
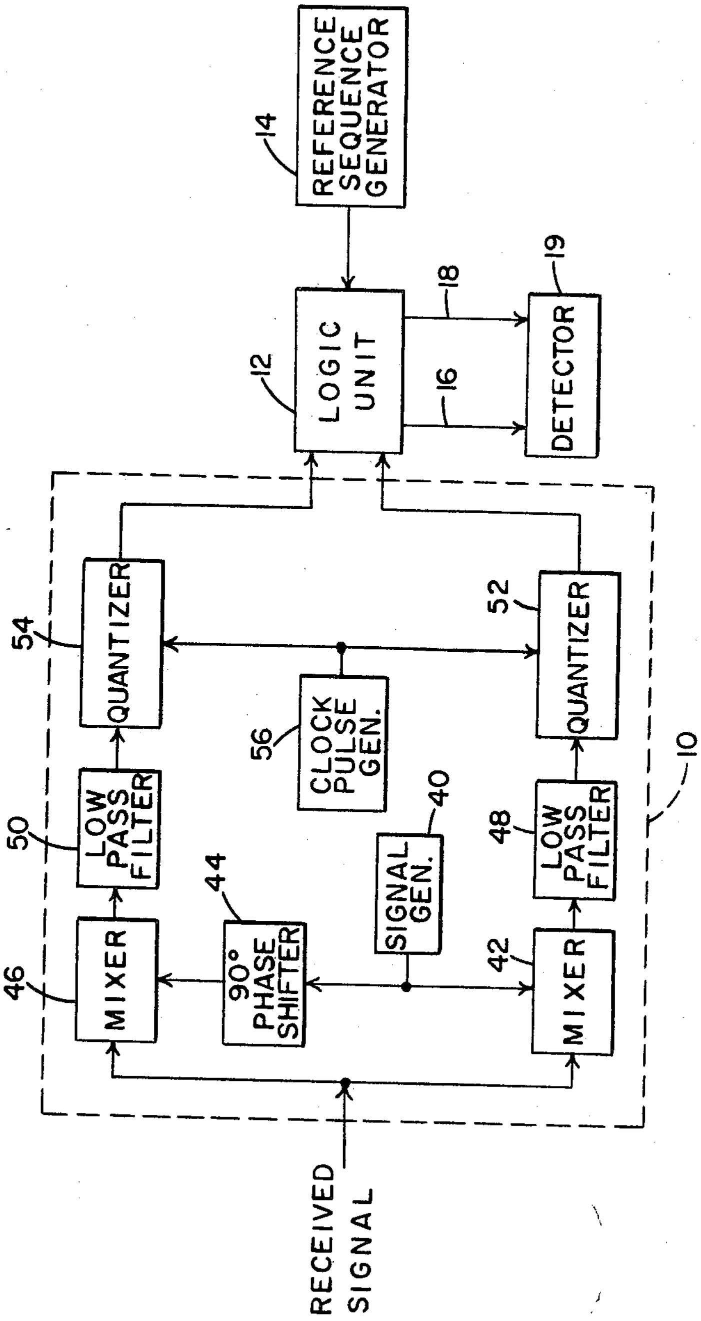
FIG. 1 is a block diagram of a digital matched filter according to the present invention.

Referring to FIG. 1, a received signal, for example, a pseudo-random phase-keyed signal is directed to a receiver 10, to be discussed in detail hereinafter, having two outputs each connected to a logic unit 12, also to be discussed in detail hereinafter. Reference sequence generator 14 supplies to logic unit 12 a third input signal, namely, the reference signal. In operation, a received signal is resolved into its quadrature components, quantized and digitized within receiver 10. The digitized quadrature components are directed to logic unit 12 where they are compared bit by bit with a reference sequence signal generated by reference sequence generator 14. The reference sequence signal may be shifted through the logic in the opposite direction to that of the received signal, or in the same direction, or it may remain stationary with only the received signal being shifted. When the reference signal bits are aligned in time with the bits of both the quadrature components and the output signal, as seen across terminals 16 and 18, the output is at a maximum level, correlation is established.

Figure 2:
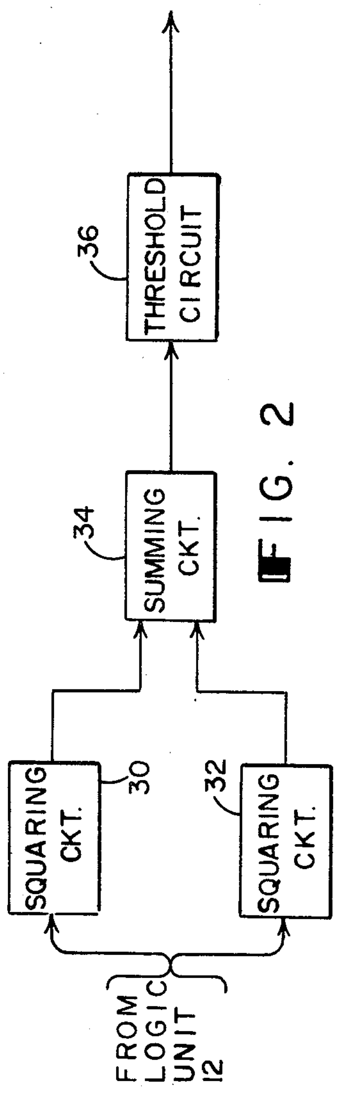
FIG. 2 is a block diagram of a typical detector which may be used to detect the output signals of the digital matched filter according to the present invention.

A typical detector that can be used in conjunction with the present invention to detect correlation is shown in FIG. 2 and includes first and second squaring circuits 30 and 32, typically diodes, having respective input connections from terminals 16 and 18 of logic unit 12 and output connections to a summing circuit 34, the output of which is connected to a threshold circuit 36. The quadrature output signals from the matched filter are squared in squaring circuits 30 and 32, added together in summing circuit 34 and directed to a threshold circuit 36 which has a preset threshold. The threshold can be exceeded when the output signals from the matched filter are at the maximum level.

Receiver description

Referring again to FIG. 1, the receiver which is employed in the digital matched filter comprises a signal generator 40 connected to a first mixer 42 typically a crystal mixer and to a phase shifter 44, the output of which is connected to a second mixer 46. The mixer output signals are connected to the inputs of respective low pass filters 48 and 50, the outputs of which are connected to respective quantizers 52 and 54, such as Schmitt trigger circuits. A second input to quantizers 52 and 54 is from a clock pulse generator 56.

In operation, a carrier signal, generated by signal generator 40, at substantially the same frequency as the input signal, is directed simultaneously to mixer 42 and through the phase shifter 44, typically a 90° phase-shift to mixer 46. The received signal, also directed to mixers 42 and 46 is mixed with the carrier signal of signal generator 40 and resolved into its quadrature components. The output signals from mixers 42 and 46 are directed to respective quantizers 52 and 54 through respective low pass filters 48 and 50 which remove unwanted harmonics and reduce noise outside the signal band. By the action of the clock pulse generator 56 gating the quantizers 52 and 54, the two quadrature components are sampled once each correlation interval and quantized, typically to two quantum levels. A positive pulse, designated a binary one, is generated if the sample is positive and no pulse, designated a binary zero, is generated if the sample is negative. (The signal to noise ratio of the matched filter can be increased by increasing the numbers of quantum levels from two to four levels within quantizers 52 and 54.) The digitized signals thus generated are directed to logic unit 12.

Logic unit description

Figure 3:
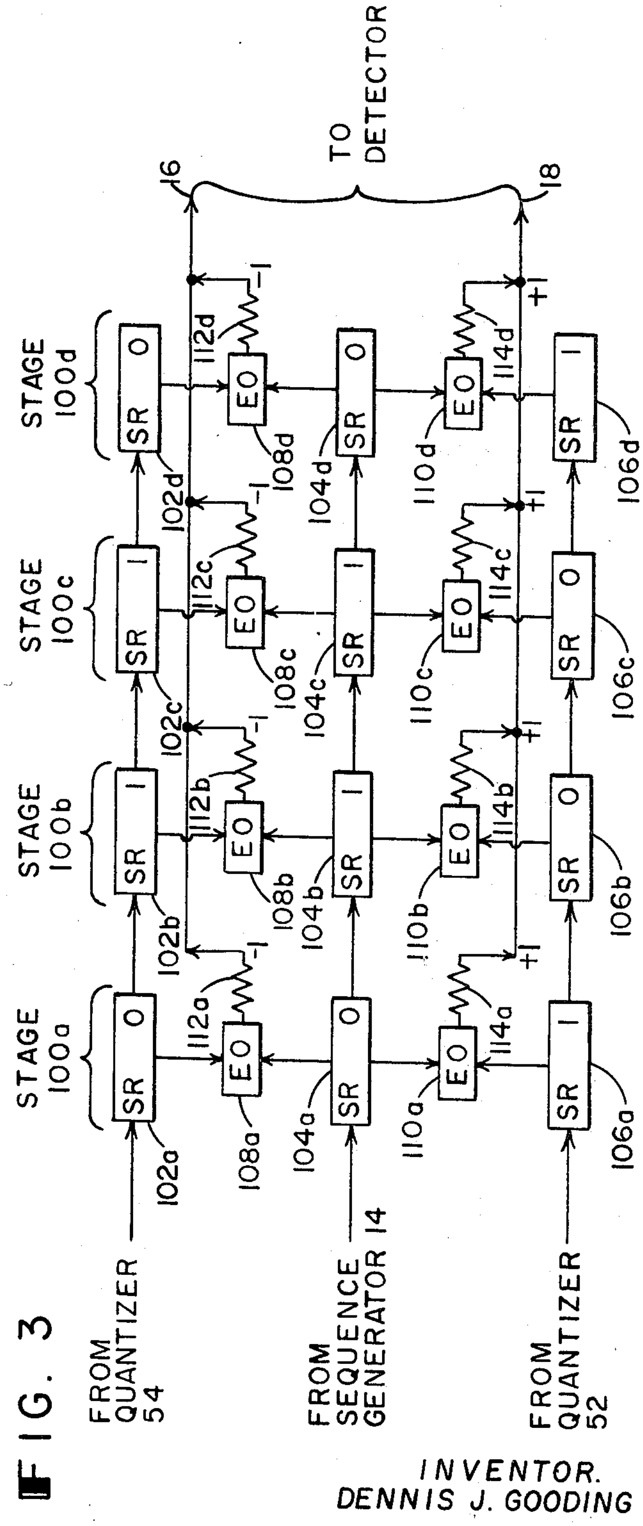
FIG. 3 is a block diagram of a logic unit employed in the present invention with a two-phase pseudo-random input signal.

Referring to FIG. 3, one embodiment of a logic unit 12 employed in the present invention for a two-phase pseudo-random phase-keyed signal, comprises a plurality of identical stages **100*a*–100*d*. (The number of stages is proportioned to the number of correlation intervals in the signal to be correlated but is shown for purposes of illustration to be a four interval sequence.) Each stage is composed of shift registers, the number of which is equal to the base two logarithm of the number of quantum levels carried in the first quadrature component of the signal at the output of quantizer 54 plus the base two logarithm of the number of quantum levels carried at the output of quantizer 52**, plus the base two logarithm of the number of quantum levels of the digital reference sequence signal.

For a two quantum level system as shown, each stage employs a total of three shift registers 102, 104 and 106. Also included within each stage are two EXCLUSIVE-OR circuits 108 and 110 and two summing elements 112 and 114, typically resistors. EXCLUSIVE-OR gate 108 has input connections from shift registers 102 and 104 while EXCLUSIVE-OR gate 110 has inputs from shift registers 104 and 106. The outputs from EXCLUSIVE-OR gates 108 and 110 are connected through respective summing elements 112 and 114 to respective terminals 16 and 18. The stages **100*a*–100*d* are connected together in the usual manner to facilitate shifting the data stored in shift registers 102*a*, 104*a*, and 106*a* sequentially through each stage to respective shift registers 102*d*, 104*d*, and 106*d*. In operation, a reference sequence signal is shifted into and stored in shift registers 104*a*–104*d*. The first bits from quantizers 52 and 54 are shifted into respective shift registers 106*a* and 102*a* and compared with the reference sequence bit stored in shift register 104*a* by respective EXCLUSIVE-OR circuits 110*a* and 108*a*. All EXCLUSIVE-OR circuits 108*a*–108*d* and 110*a*–110*d*** have two inputs and the following truth table:

| Inputs 1 | Inputs 2 | Output level |
|---|---|---|
| 1 | 1 | −1 |
| 0 | 0 | −1 |
| 1 | 0 | +1 |
| 0 | 1 | +1 |

In essence, when the two binary inputs to the EXCLUSIVE-OR circuits are the same, the output signal is a minus one, and when the inputs are dissimilar, the output signal is a plus one. The output signals from EXCLUSIVE-OR circuits **108*a–b* are directed to logic unit output terminal 16 through respective summing resistors 112*a*–112*d* and the output signals of EXCLUSIVE-OR circuits 110*a*–110*d* are directed to terminal 18 through respective summing resistors 114*a*–114*d*. As the input signals are shifted from stage 100*a* through 100*d*, a bit by bit comparison is made between each of the quadrature components and the stored reference signal and the results of the comparison are added at terminals 16 and 18**. A maximum output level indicated correlation between the received and reference signals.

Figure 4A:
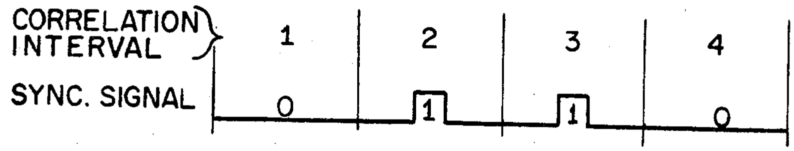
FIGS. 4A through 4I are wave shapes useful in explaining the operation of the match filter of FIGS. 1 and 3.
Figure 4B:
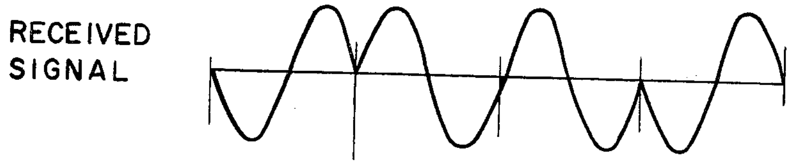
Figure 4C:
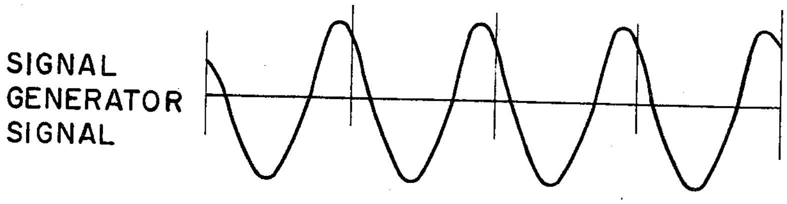
Figure 4D:
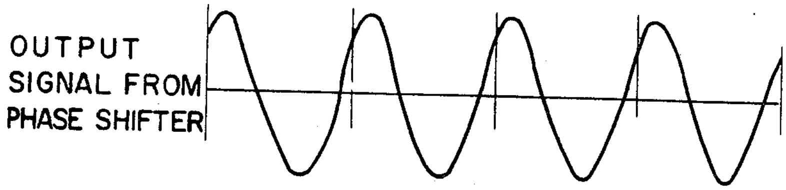
Figure 4E:
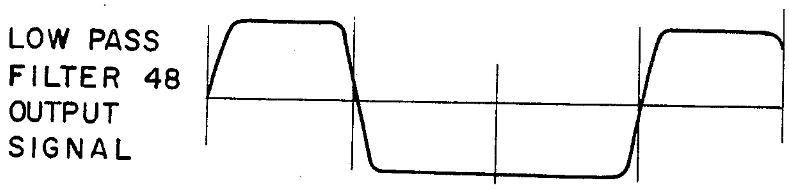
Figure 4F:
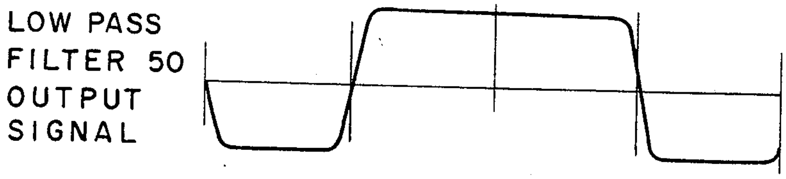
Figure 4G:
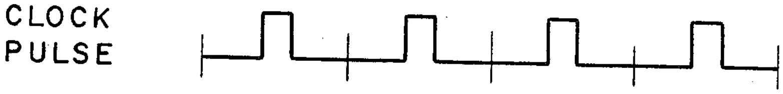
Figure 4H:
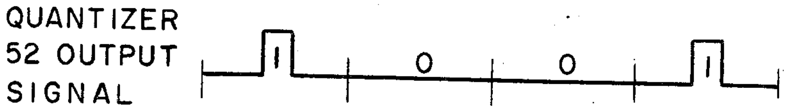
Figure 4I:
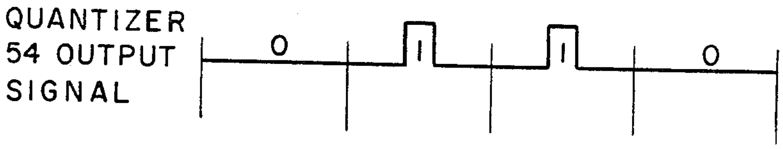

To better understand the operation of the digital matched filter according to the present invention, the wave shapes of FIGS. 4A–4I will be used in conjunction with FIGS. 1 and 3. FIG. 4A shows a binary representation of a typical synchronization signal, and FIG. 4B shows the resultant wave shape of a two-phase pseudo-random received signal with the synchronization signal impressed thereon. (Note that for a binary zero the received signal has one phase and for a binary one it has a second phase 180° from that of the binary zero.) The signal, 4B, constitutes a received signal at the input to mixers 42 and 46. FIG. 4C represents the carrier signal supplied to mixers 42, and FIG. 4D represents the shifted carrier signal from phase shifter 44 applied to mixer 46. The polarity of a mixer output signal and thus that of an associated low pass filter is a function of the phase relationship between the two signals being mixed. For example, in the first correlation interval, the received signal, FIG. 4B, and the carrier signal, FIG. 4C, are almost in phase such that when multiplied together in mixer 42 the output will be positive because the signs of the sine waves representing the two signals are the same. Contrasted with the case of mixing the received signal with the phase shifted carrier signal of FIG. 4D, the sign of the received signal of FIG. 4B is the opposite to that of the reference signal of FIG. 4D such that when they are multiplied in mixer 46 a negative output signal will result. The output signals from respective low pass filters 48 and 50 as shown in FIGS. 4E and 4F are directed to respective quantizers 52 and 54 where they are sampled at the clock rate, FIG. 4G, and quantized to two levels. That is, if the input signal to a quantizer is positive, a binary one is generated, and if the input signal is negative, a binary zero is generated. The sampled quantized output signals are shown in FIGS. 4H and 4I.

Referring now to FIG. 3, a reference sequence signal, the same as the synchronization signal in FIG. 4A, is stored in shift registers **104*a*–104*d*. The quantizer output signals as shown in FIGS. 4H and 4I are shifted into respective shift registers 106*a*–106*d* and 102*a*–102*d* where a bit by bit comparison is made with the reference sequence signal stored in registers 104*a*–104*d*. When the first bits representing the quadrature components of the received signal reach shift registers 102*d* and 106*d* and a comparison between the stored reference signal and the quadrature component signals is made, a maximum output signal occurs at terminals 16 and 18 indicating correlation. The input signals to EXCLUSIVE-OR circuits 108*a*–108*d* are the same, thus producing —1 output signals according to the truth table. The input signals to EXCLUSIVE-OR circuits 110*a*–110*d* are dissimilar, thus producing +1 output signals. When the output signals of EXCLUSIVE-OR circuits 108*a*–108*d* and 110*a*–110*d* are summed at respective terminals 16 and 18, an output level of —4 and +4 respectively results. Since this level is the maximum output level possible, correlation has been established between the received synchronization signal of FIG. 4A and the stored reference sequence signal in shift registers 104*a*–104*d***.

Multiphase logic

Figure 5:
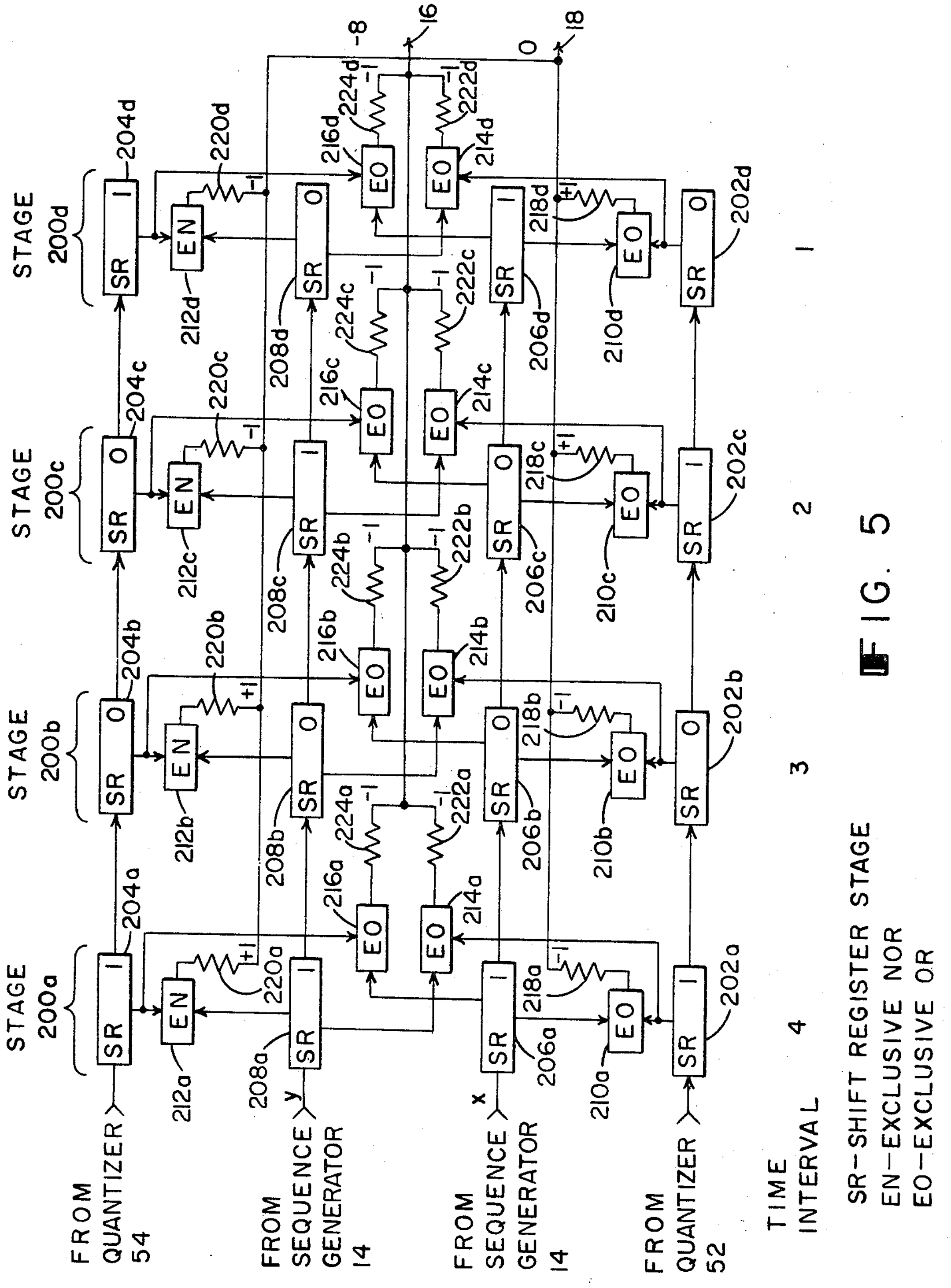
FIG. 5 is a block diagram of a logic unit employed in the present invention with an input signal having two or more phases.

The digital matched filter according to the present invention may be employed for signals having a wide range of phase variations, both discrete and continuous. For input signals having more than the two-phase variation as described hereinabove, a logic unit as depicted in FIG. 5 is employed. This logic unit can be employed for the two-phase case also, but because of the simplicity of the logic unit shown in FIG. 3 it is preferable with a two-phase signal. The multiphase logic unit employs identical stages, the number of which depends upon the number of correlation intervals in the incoming signal that represents synchronization data. The general expression, given hereinabove, for determining the number of shift registers per stage is the same for the multiphase logic unit. For purpose of illustration, a four stage **200*a*–200*d* unit is used wherein each stage comprises two shift registers 202*a* and 204*a* to store the quadrature component signals from respective quantizers 52 and 54; two storage registers 206*a* and 208*a* to store the bits from the reference sequence signal; three EXCLUSIVE-OR circuits 210*a*, 214*a*, and 216*a* wherein EXCLUSIVE-OR circuit 210*a* has input connections from shift registers 202*a* and 206*a*, EXCLUSIVE-OR circuit 214*a* has input connections from shift registers 202*a* and 208*a* and EXCLUSIVE-OR circuit 216*a* has input connections from shift registers 204*a* and 206*a*; one EXCLUSIVE-NOR circuit 212*a* with input connections from shift registers 204*a* and 208*a*; and summing resistors 218*a*, 222*a*, 224*a*, and 220*a* connected to respective EXCLUSIVE-OR circuits 210*a*, 214*a*, 216*a*, and EXCLUSIVE-NOR circuit 212*a***.

In operation, a reference sequence signal composed of two components from the reference sequence generator 14 are stored in shift registers **206*a*–206*d* and 208*a*–208*d* while the quantized quadrature components of the received signal are shifted into shift registers 202*a*–202*d* and 204*a*–204*d*. When the first quadrature bits arrive at registers 202*a* and 204*a*, each bit is compared with the reference bits stored in registers 206*a* and 208*a*. The quantized bit stored in register 202*a* is compared to the reference bits in registers 206*a* and 208*a* by respective EXCLUSIVE-OR circuits 210*a* and 214*a* and the quantized bit stored in register 204*a* is compared to the same reference signals by EXCLUSIVE-OR circuit 216*a* and EXCLUSIVE-NOR circuit 212*a*, respectively. The EXCLUSIVE-NOR circuits 212*a*–212*d* have an inverse truth table to that of the EXCLUSIVE-OR circuits as described hereinabove. That is, if both input signals are the same, the output signal is a +1; and if the two input signals are not the same, the output signal is a —1. The quadrature data are sequentially shifted through stages 200*a*–200*d* and a bit by bit comparison is made with both components of the reference sequence signal. The results of the comparisons made by EXCLUSIVE-OR circuits 210*a*–210*d* and EXCLUSIVE-NOR circuits 212*a*–212*d* appear at output terminal 18 via respective resistors 218*a*–218*d* and 220*a*–220*d*. Contemporaneously, the results of the comparisons as made by EXCLUSIVE-OR circuits 214*a*–214*d* and 216*a*–216*d* appear at output terminal 16 via respective summing resistors 222*a*–222*d* and 224*a*–224*d***.

Figures 6A, 6B, 6C, 6D, 6E, 6F, 6G, 6H:
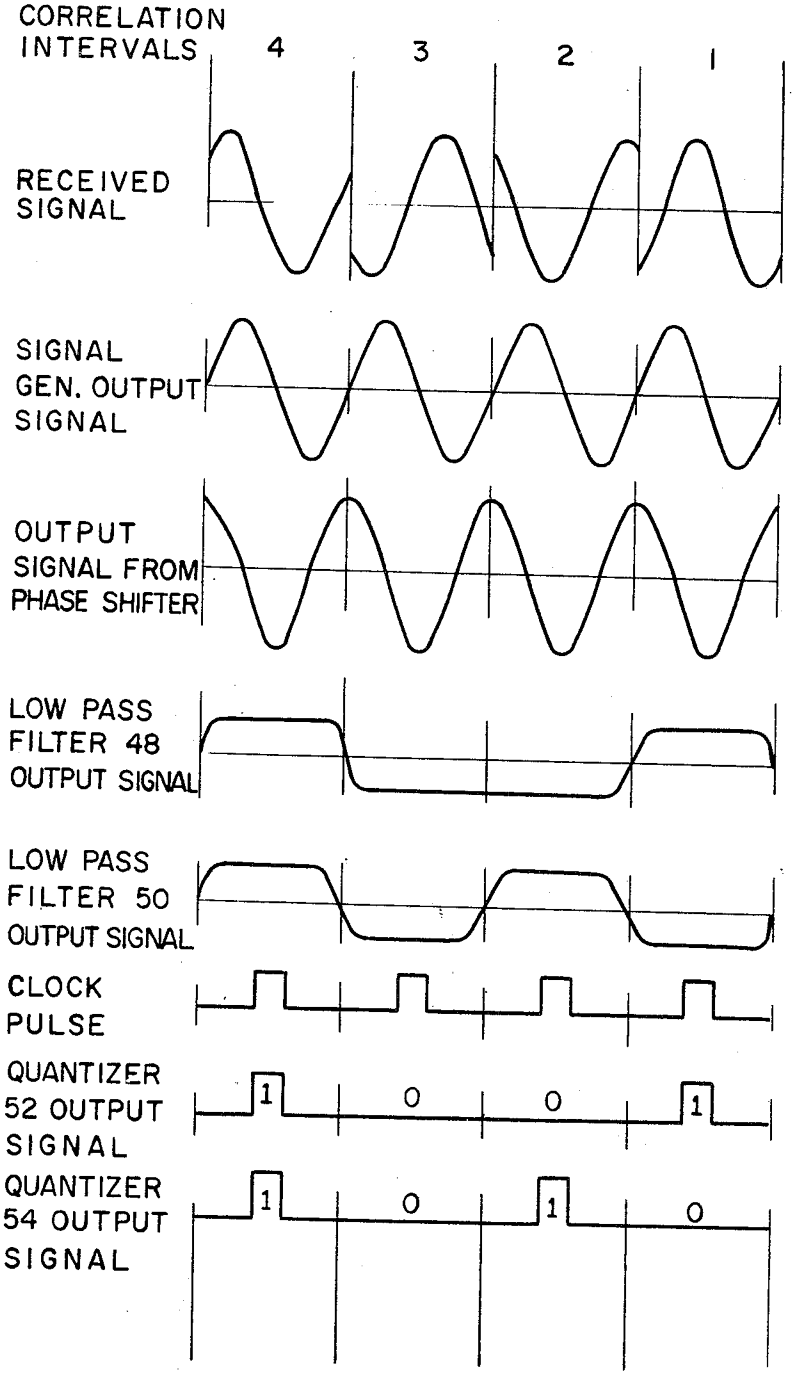
FIGS. 6A–6H are wave shapes useful in explaining the operation of the apparatus of FIGS. 1 and 5.
Figures 7A, 7B:
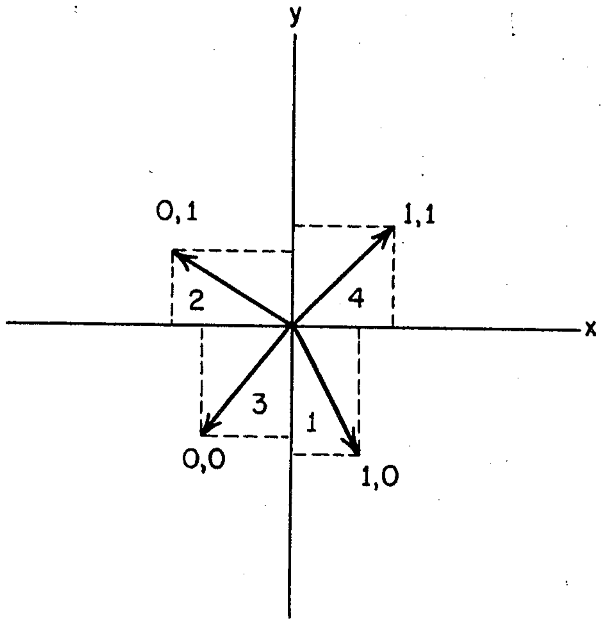
FIGS. 7A and 7B are a vector diagram and table, respectively, useful in determining the stored sequence for a multiphase input signal employed in the logic unit of FIG. 5.

To better understand the digital matched filter employing the multiphase logic unit according to the present invention, the wave shapes and vectors in FIGS. 6A–6H and FIGS. 7A–7B, respectively, will be used in conjunction with FIGS. 1 and 5. A multiphase signal, for illustration purposes, a four-phase pseudo-random signal having the particular phase variations shown in FIG. 6A and occurring at the particular correlation intervals indicated, constitutes an arbitrary synchronization signal. The sine waves in each correlation interval can be represented by a vector as shown in FIG. 7A. The sine wave in occurring in interval 1 starts at an angle greater than 270° but less than 360° and is therefore in the fourth quadrant. Similarly, the sine wave of intervals 2 is greater than 90° but less than 180° and is therefore in the second quadrant; the sine wave of interval 3 is greater than 180° but less than 270° and is therefore in the third quadrant. The sine wave occurring interval 4 is greater than 0° but less than 90° and is therefore in the first quadrant. As is well known, a vector can be represented by its quadrature components, for example by the $x$ and $y$ values as indicated in FIG. 7A.

If the $x$ or $y$ value of the particular vector is positive, it is represented by a 1, and conversely if either is negative, it is represented by a zero. The respective $x$ and $y$ values per correlation interval as tabulated in FIG. 7B constitute the components of the sequence reference signal that is stored in respective registers **206*a*–206*d* and 208*a*–208*d*. When the received signal as shown in FIG. 6A arrives at mixers 42 and 46, it is mixed with the carrier signal and the shifted carrier signal as shown in FIGS. 6B and 6C, respectively. The resultant quadrature output signals from mixers 42 and 46 after passing through respective low pass filters 48 and 50 are shown in FIGS. 6D and 6E, respectively. With the sampling rate and pulse width set by clock pulse, FIG. 6F, the output signals from low pass filters 48 and 50 are quantized in respective quantizers 52 and 54 wherein a binary one is generated if the signal is positive and a binary zero if the signal is negative. The digitized quadrature components (and their binary equivalent) shown in FIGS. 6G and 6H constitute the input signals for respective registers 202*a*–202*d* and 204*a*–204*d***.

A bit by bit comparison is made between each of the signals from the quantizers 52 and 54 and the $x$ and $y$ components of the reference sequence signal for each interval as the input signals are shifted through stages **200*a*–200*d*. When the bits representing the quadrature components of the received signal arriving at correlation interval 1 reach stage 200*d*, as shown in FIG. 5, with the binary ones and zeros in the appropriate shift registers, a maximum output signal occurs across terminals 16 and 18 indicating correlation. (Note the output signal from quantizer 52 is necessarily the same as the $x$ component of the stored reference sequence signal and the output signal from quantizer 54** is necessarily the same as the $y$ component of the stored reference sequence signal in order to establish correlation.)

Referring to FIG. 5, a detailed operation of the logic unit is as follows. One quadrature component of the received signal, stored in registers **202*a*–202*d*, is compared with the $x$ or $y$ component of the reference sequence signal stored in respective registers 206*a*–206*d* at EXCLUSIVE-OR circuits 210*a*–210*d*, respectively. Under the criteria that equal inputs to an EXCLUSIVE-OR circuit yield a —1 output and dissimilar inputs yield a +1 output, the output signals from EXCLUSIVE-OR circuits 210*a* and 210*b* are —1 and the output signals from EXCLUSIVE-OR circuits 210*c* and 210*d* are +1. Since the output signals are summed at terminal 18, the net result is zero. Contrary results occur when the data stored in registers 202*a*–202*d* is compared with the data stored in respective registers 208***a*–208*d* at EXCLUSIVE-OR circuits 214*a*–214*d*, respectively. Since the data in the respective registers is the same, a —4 output signal is seen at terminal 16. Similarly, the data stored in registers 204*a*–204*d* is compared to the data stored in respective registers 208*a*–208*d* and 206*a*–206*d* at EXCLUSIVE-NOR circuits 212*a*–212*d* and EXCLUSIVE-OR circuits 216*a*–216*d*, respectively. Since the data in registers 204*a*–204*d* is the same as that in registers 206*a*–206*d*, output levels from EXCLUSIVE-OR circuits 216*a*–216*d* will be the same —1, yielding also a —4 at terminal 16. Thus, a maximum signal, —8, occurs between terminals 16 and 18 indicating correlation.

From the foregoing, it is evident that a digital matched filter has been provided. Although a preferred embodiment of the invention has been shown and described, modifications and alternative implementations will occur to those skilled in the art without departing from the true scope of the invention. For example, by con-match the anticipated received signal, a correlation sys-tinuously changing the reference sequence signal to tem is obtained. Accordingly, the invention is not to be limited by what has been particularly shown and described except as indicted in the following claims.

What is claimed is:

1. A digital matched filter comprising:
receiver means operative in response to a received signal to produce a pair of digital quadrature components of the received signal;
an independent source of a digital reference signal operative to provide independently of the received signal a digital reference signal; and
digitail logic circuitry operative to compare simultaneously both of said signal quadrature components with said digital reference signal and to produce an output signal representing correlation between said digitial quadrature components and said digital reference signal.

2. A digital matched filter according to claim 1 wherein the receiver means comprises:
means operative in response to a received signal to separate said received signal into its two quadrature components;
a clock pulse generator operative to generate clock pulse signals; and
quantizing circuitry operative in response to said quadrature components and said clock pulse signals to quantize each of said quadrature components into a number of quantum levels and to digitize said quantum levels.

3. A digital matched filter according to claim 2 wherein said means operative in response to a received signal to separate said received signal into its quadrature components includes:
a source of a carrier signal;
a phase shifter operative to shift the phase of said carrier signal;
a first mixer operative in response to said received signal and said carrier signal to produce one quadrature component of said received signal;
a second mixer operative in response to said received signal and the phase shifted carrier signal to produce the other quadrature component of said received signal; and
first and second low pass filters, said first filter being operative to remove out of band noise from the signal output of said first mixer and said second low pass filter being operative to remove out of band noise from the output signal of said second mixer.

4. A digital matched filter according to claim 2 wherein said logic circuitry includes a plurality of stages, each stage comprising:
a first shift register operative to store one bit of one of said quadrature components;
a second shift register operative to store one bit of the other of said quadrature components;
a third shift register operative to store one bit of said reference signal;
a first EXCLUSIVE-OR circuit having input connections from said first and third shift registers and being operative to provide a first predetermined signal when the one bit of said first shift register is the same as the bit in said third shift register and to provide a second predetermined signal when the one bit of said first shift register is unlike the bit in said third shift register; and
a second EXCLUSIVE-OR circuit having input connections from said second and third shift registers and being operative to provide the second predetermined signal when the one bit of said second shift register is the same as the bit in said third shift register and to provide the first predetermined signal when the one bit of said second shift register is unlike the bit in said third shift register.

5. A digital matched filter according to claim 4 wherein each of said stages employs a number of shift registers equal to the total of the base two logarithm of said number of quantum levels in each of said quadrature components plus the base two logarithm of the number of quantum levels of said digital reference sequence signal.

6. A digital matched filter according to claim 2 wherein said logic unit incdudes a plurality of stages, each stage comprising:
a first shift register operative to store one bit of one of said quadrature components;
a second shift register operative to store one bit of the other of said quadrature components;
a third shift register operative to store a first bit of said digital reference signal;
a fourth shift register operative to store a second bit of said digital reference signal, said second bit occurring in the same time interval as said first bit of said digital reference signal;
a first comparator circuit having input connections from said first shift register and said third shift register and being operative to provide a first predetermined signal when the one bit of said first shift register is the same as the first bit of said third shift register and to provide a second predetermined signal when the one bit of said first shift register is unlike the first bit of said third shift register;
a second comparator circuit having input connections from said first shift register and said fourth shift register and being operative t o provide the seocnd predetermined signal when the one bit of said first shift register is the same as the second bit of said fourth shift register and to provide the first predetermined signal when the one bit of said first shift register is unlike the second bit of said fourth shift register;
a third comparator circuit having input connections from said second shift register and said third shift register and being operative to provide the second predetermined signal when the one bit of said second shift register is the same as the first bit of said third shift register and to provide the first predetermined signal when the one bit of said second shift register is unlike the first bit of said third shift register;
a fourth comparator circuit having input connections from said second shift register and said fourth shift register and being operative to provide the second predetermined signal when the one bit of said second shift register is the same as the second bit of said fourth shift register and to provide the first predetermined signal when the one bit of said second shift register is unlike the second bit of said fourth shift register;

a first summing circuit connected to said second and third comparator circuits and being operative to add the output signals of said second and third comparator means; and a second summing circuit connected to said first and fourth comparator circuits and being operative to add the output signals of said first and fourth comparator circuits.

7. A digital matched filter according to claim 6 wherein said first comparator circuit is an EXCLUSIVE-NOR circuit;

said second, third and fourth comparator circuits are EXCLUSIVE-OR circuits;

said first predetermined signal is of one polarity; and said second predetermined signal is of a second polarity.

References Cited

UNITED STATES PATENTS

| | | | |
|---|---|---|---|
| 3,161,828 | 12/1964 | Cattermole | 325—60 XR |
| 3,274,379 | 9/1966 | Hinrichs | 340—146.2 XR |
| 3,371,279 | 2/1968 | Lender | 178—67 XR |
| 3,384,824 | 5/1968 | Grenier | 325—60 XR |
| 3,402,265 | 9/1968 | Couvillon | 178—67 XR |

GARETH D. SHAW, Primary Examiner

S. CHIRLIN, Assistant Examiner